United States Patent [19]  
Fling

[11] Patent Number: 4,652,907  
[45] Date of Patent: Mar. 24, 1987

[54] APPARATUS FOR ADAPTIVELY CONTROLLING A VIDEO SIGNAL RECURSIVE FILTER

[75] Inventor: Russell T. Fling, Fishers, Ind.

[73] Assignee: RCA Corporation, Princeton, N.J.

[21] Appl. No.: 715,817

[22] Filed: Mar. 25, 1985

[51] Int. Cl.$^4$ .................. H04N 9/64; H04N 5/213
[52] U.S. Cl. ................................ 358/36; 358/167
[58] Field of Search ............................ 358/36, 167

[56] References Cited

U.S. PATENT DOCUMENTS

| | | | |
|---|---|---|---|
| 4,064,530 | 12/1977 | Kaiser et al. | 358/36 |
| 4,240,106 | 12/1980 | Michael et al. | 358/36 |
| 4,249,210 | 2/1981 | Storey et al. | 358/167 |
| 4,268,855 | 5/1981 | Takahashi | 358/36 |
| 4,275,418 | 6/1981 | Trump et al. | 358/167 |
| 4,291,333 | 9/1981 | Warnock et al. | 358/36 |
| 4,296,436 | 10/1981 | Achiha | 358/167 |
| 4,361,853 | 11/1982 | Remy et al. | 358/167 |
| 4,388,729 | 6/1983 | Spencer et al. | 455/72 |
| 4,390,894 | 6/1983 | Raven | 358/36 |
| 4,392,123 | 7/1983 | Brüggemann | 340/347 |
| 4,485,403 | 11/1984 | Illetschko | 358/167 |
| 4,539,594 | 9/1985 | Illetschko | 358/36 |
| 4,549,213 | 10/1985 | Illetschko | 358/36 |

FOREIGN PATENT DOCUMENTS

| | | |
|---|---|---|
| 0023823 | 2/1981 | European Pat. Off. |
| 3150008 | 8/1983 | Fed. Rep. of Germany |
| 2031686 | 3/1980 | United Kingdom |
| 1605025 | 12/1981 | United Kingdom |
| 2099657 | 12/1982 | United Kingdom |
| 2102651 | 2/1983 | United Kingdom |
| 2136655 | 9/1984 | United Kingdom |

OTHER PUBLICATIONS

H. Urkowitz, "Analysis and Synthesis of Delay Line Periodic Filters" IRE Trans. on Circuit Theory, Jun. 1957, pp. 41-53.

Primary Examiner—Michael A. Masinick  
Assistant Examiner—Robert Michael Bauer  
Attorney, Agent, or Firm—E. M. Whitacre; P. J. Rasmussen; E. P. Herrmann

[57] ABSTRACT

A video signal recursive filter includes circuitry for controlling the integration time of the filter. The control circuitry develop a motion-threshold value responsive to the noise content of signal differences developed by subtracting a processed signal, delayed by a frame period, from an incoming video signal. The signal differences are compared against the motion threshold to develop motion signals indicating the history of image motion for each picture element. Circuitry responsive to the signal noise content develops a signal which is coupled to the motion signals to form address codewords that are applied to a ROM programmed with predetermined control signals for establishing the integration time of the recursive filter.

9 Claims, 2 Drawing Figures

APPARATUS FOR ADAPTIVELY CONTROLLING A VIDEO SIGNAL RECURSIVE FILTER

This invention relates to circuitry for adaptively controlling digital recursive filters.

BACKGROUND OF THE INVENTION

The invention will be described in the environment of a video signal processing system, however, it is to be understood that it is not limited to such applications.

In video systems recursive filters may be used to reduce noise in the frequency band of the video signal. From frame-to-frame there is a relatively high degree of signal correlation. Thus, if a video signal from successive frames is summed, the correlated video signal will add linearly, but random noise accompanying the signal will not. The summed signal is generally normalized to a desired amplitude range and the signal-to-noise ratio of the averaged signal is enhanced by the processing.

A typical video recursive filter includes a delay device coupled in a recirculating loop with circuitry for combining a fraction of delayed signal with a fraction of incoming signal. The combined signal is applied to the delay device which delays the combined signal by the time period necessary to insure that constituent parts of each combined video signal samples are from corresponding pixels of successive video frames. The fractional parts of the incoming and delayed signals are obtained by scaling the two signals by factors K and (1−K) respectively. Thus, if the amplitude of the incoming signal is equal to the amplitude of the averaged signal from the delay device, the new combined signal will be normalized to equal the input signal. In a digital processing system, the normalization tends to minimize the sample bit size required of the delay device. If the incoming signal consists of 8-bit samples, the sample size in the delay device can be held to e.g. 9 or 10 bits. This is an important design aspect in reducing the manufacturing costs of recursive filters for consumer applications.

When the images represented by video signals change, recursively filtered video signals tend to be degraded. Phantom images are introduced in the reproduced images and picture sharpness along moving image edges is degraded. To counter these undesirable effects it is known to adaptively change the parameters of the recursive filter when motion occurs. The adaptive changes are performed independently for each picture element (pixel). Typically changes are made to the filter scale factors in response to the amplitude of the change in the video signal between successive frames. For larger interframe video signal changes a larger fraction of the incoming signal is applied in the averaging process and for smaller interframe video signal changes a larger fraction of the averaged delayed signal is applied in the averaging process.

After interframe image motion ceases a recursive filter system can be conditioned to more rapidly converge to the desired noise reduction level by applying a sequence of successively smaller scale factors. The timing of the sequence is determined separately for each pixel and is a function of the history of the interframe image motion for the respective pixels. An example of this type of system is described in U.S. Pat. No. 4,240,106 entitled "Video Noise Reduction". The system in this patent develops sequences of scale factors for each pixel wherein successive scale factor values are equal to the reciprocals of the number of frames from the last frame in which motion was detected.

While the foregoing systems tend to enhance the performance of recursive filters in video signal processing systems they do not address an important element in the filtering process. This element is the amplitude of the noise in the signal being processed. If the noise level is low, less noise reduction is required and the filter may be adaptively conditioned to converge at a faster rate than when a greater degree of noise reduction is requred. Programming the system for less noise reduction when the signal noise level is low tends to condition the system to be more tolerant to interframe image motion.

In accordance with the present invention, it is an object to adaptively control a recursive filter as a function of the noise level of the signal to be processed.

Motion detectors for recursive filter systems typically measure the video signal differences between successive frames to determine if the image has changed. Noise attendant these video signals may trigger the motion detector to produce a false indication of motion causing the system to undesirably affect noise reduction. It is a further object of this invention to provide a motion detection system with a low incidence of false motion indications.

SUMMARY OF THE INVENTION

The present invention is circuitry for adaptively controlling a recursive filter. Incoming or current signal and delayed signal are applied to a subtractor which develops signal differences. The signal differences are applied to a minimum detector which selects the smallest signal difference in a predetermined interval. In one embodiment of the invention, the selected signal difference is coupled to the address input of a read only memory which is programmed to provide scale factor coefficients to the recursive filter dependent on the amplitude or range of amplitudes of the selected signal difference.

In another embodiment of the invention, the selected signal difference is coupled to a threshold determining circuit for developing a noise dependent threshold value. The noise dependent threshold is coupled to one input of a comparator. Signal differences from the subtractor are applied to a second input of the comparator. If respective signal differences exceed the noise dependent threshold the comparator develops motion signals. The motion signals are coupled to a read only memory to produce scale factor coefficients for the recursive filter.

DETAILED DESCRIPTION

In the figures, broad arrows interconnecting circuit elements represent multiconductor connections for parallel-bit samples. Narrow arrows interconnecting circuit elements represent single conductor connections for serial bit digital samples or analog signals.

Figure 1:
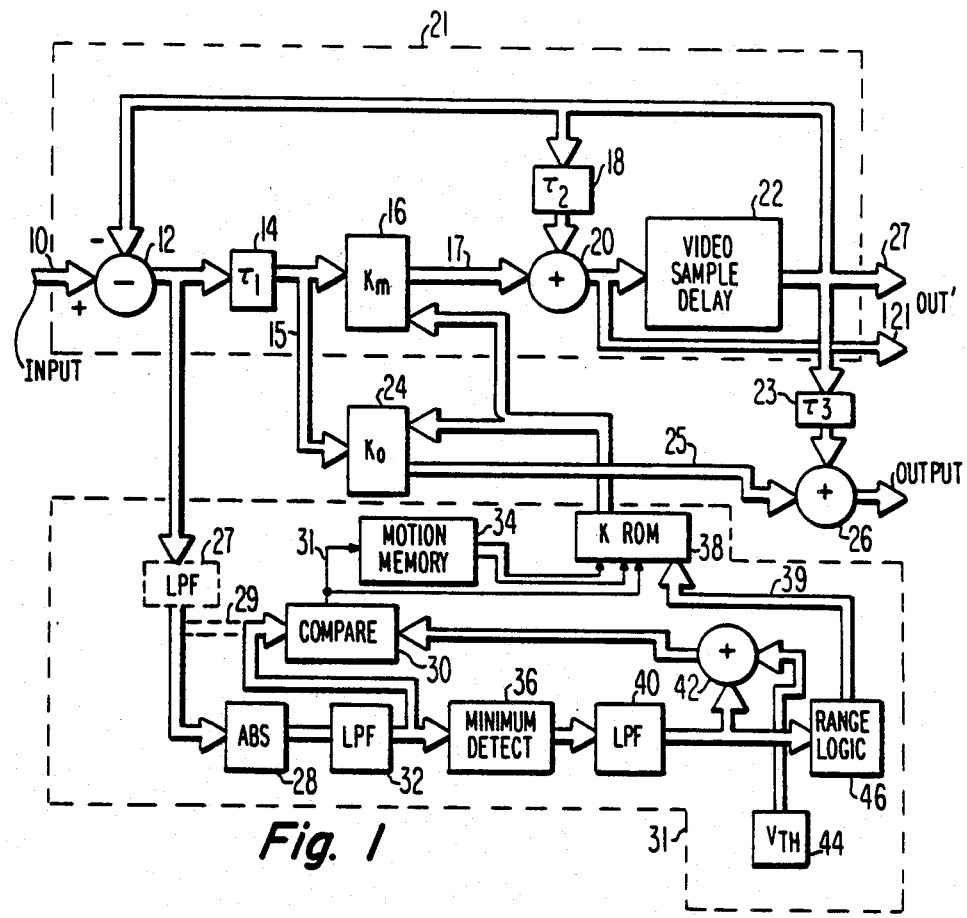
FIG. 1 is a block diagram of an adaptive recursive filter employing scale factor generating circuitry embodying the present invention, which recursive filter is arranged to perform noise reduction and separation of the luminance component from composite video signal.

FIG. 1 is a motion/noise adaptive recursive filter for processing video signals. The circuitry circumscribed by the dashed line boxes 21 and 31 defines the more general system. The entire circuitry shown in FIG. 1 is directed toward the more specific application, of separating the luminance component from composite video signal.

The circuitry circumscribed in the dashed box 21 is a recursive filter of the type generally described in U.S. Pat. No. 4,485,403, and is adaptive by virtue of the capability to change the scale factor $K_m$ of scaling circuit 16. Noise reduced video signal samples are available at the output connection, 27, of the video signal sample delay element 22. Alternatively noise reduced video signal samples may be taken from the input connection 121 of the video signal samples delay element 22.

Briefly, circuit 21 operates as follows. Video signal samples, $V_x$, to be processed are applied from input port 10 to a subtracter 12. Delayed samples $V_{DY}$ from delay element 22 are coupled to a second input port of subtracter 12 which develops the difference samples $(V_x - V_{DY})$. The difference samples are coupled via compensating delay element 14, to the input of scaling circuit 16. Scaling circuit 16 develops scaled difference sample values $K_m(V_x - V_{DY})$ which are coupled to an input port of adder 20. Delayed samples $V_{DY}$ from delay element 22 are coupled via compensating delay element 18 to a second input port of adder 20 which develops the sample sums $V_Y$ given by $$V_Y = V_{DY} + K_m(V_x - V_{DY}) \quad (1)$$
$$= K_m V_x + (1 - K_m) V_{DY}.$$

The delay element 22 and the compensating delay elements 14 and 18 are designed so that the samples $V_x$ and $V_{DY}$ combined in subtracter 12 correspond to like pixels of succeeding frames. Compensating delay element 14 is required to afford circuitry 31 time to develop scale factors $K_m$, for scaling circuit 16 on a pixel-by-pixel basis, i.e. a sample-by-sample basis. Compensating delay element 18 is provided to accomodate the delay introduced by both the compensating delay element 14 and the scaling circuit 16.

The values of samples $V_{DY}$ correspond to the samples $V_Y$ delayed by one video frame period. Expanding equation (1) by substituting $V_Y$ for $V_{DY}$ with the appropriate time shift and simplifying it can be shown that the signal component, $V_{SY}$, of samples $V_Y$ equal the signal component, $V_{SX}$, of the input samples $V_x$. The noise component $V_{NY}$ of the samples $V_Y$ is reduced by the factor $\sqrt{K_m/(2-K_m)}$. These results assume that the signal component $V_{SX}$ is in component video form, i.e. either luminance or chrominance signal. However, if the signal component $V_{SX}$ is a chrominance component or composite video including a chrominance component, provision must be made to invert the phase of the chrominance component before it is fed back from the delay element 22 to elements 12 and 20. Such chrominance component phase inversion is known in the art of video signal recursive filters.

Assuming that the input signal is a composite video signal, and that no provision is made for chrominance phase inversion, the samples $V_{SY}$ will have a luminance component $V_{LY}$ and a chrominance component $V_{CY}$. In the absence of interframe image motion, the luminance component $V_{LY}$ will converge to a value which is equal to the input luminance component $V_{LX}$. The chrominance component $V_{CY}$ in the absence of motion will tend to converge to the value given by $$V_{CY} = V_{CX} K_m/(2-K_m). \quad (2)$$

In an adaptive system the values of the scale factor $K_m$ are determined on a pixel-by-pixel basis according to the history of interframe image motion for each pixel. If motion exists between the current frame and the preceding frame the scale factor, $K_m$, may be set to a value of one in order not to incur signal bandwidth reduction. When interframe image motion ceases the scale factor $K_m$ is established at a value or a sequence of values less than one, which values are determined by the time desired for the system to converge to the steady state and the desired amount of noise reduction.

Additional elements 24 and 26 are coupled with recursive filter 21 in order to process composite video to produce a noise reduced luminance component with complete cancellation of the chrominance component. To accomplish complete cancellation of the chrominance component, the chrominance component $V_{CY}$ at the output of adder 20 must be made to converge to a steady state value the first frame of no motion. If this condition is obtained a portion of the input chrominance component can be subtracted from $V_Y$ or $V_{DY}$ to completely cancel the chrominance component therein. Causing the chrominance component to converge in the first frame of no motion may be achieved if three values for $K_m$ are applied which correspond to "one" for motion, $1/(2-K_m)$ the first frame after motion, and $K_m$ for successive frame periods. With this sequence of scale factor values, the chrominance component, $V_{CY}$ converges to $K_m/(2-K_m)$ times the input chrominance component value the first frame of no motion.

Noise reduced luminance with the chrominance component cancelled is available at the output port of adder 26. Samples from delay element 22 are coupled via compensating delay element 23 to one input port of adder 26. Scaled sample differences from scaling circuit 24 are coupled to a second input port of adder 26. Sample differences from subtracter 12 are applied to the input of scaling circuit 24.

Output samples, $V_o$, from adder 26 are expressed by the equation $$V_o = K_o(V_x - V_{DY}) + V_{DY} \quad (3)$$

where $K_o$ is the scale factor applied to scaling circuit 24. The values of the scale factor $K_o$ are "one" during interframe image motion, one-half for the first frame after motion, and $K_m/2$ for succeeding frames. Rearranging equation (3) and solving for the luminance component $V_{LO}$ and the chrominance $V_{CO}$ $$V_{LO} = K_o V_{LX} + (1 - K_o) V_{LD} \quad (4)$$

$$V_{CO} = K_o V_{CX} + (1 - K_o) V_{CDY} \quad (5)$$

From equations (4) and (5) for $K_o$ equal to "one" i.e. during motion periods, $V_{LO}$ and $V_{CO}$ are equal to $V_{LX}$ and $V_{CX}$ respectively. Thus, alternate means must be provided to separate luminance and chrominance during motion intervals. An example of such alternate means may be a low-pass filter connected in parallel with the recursive filter, which is switched into the circuit when motion is detected.

During the first frame of no motion the scale factor $K_o$ is set to one-half. The samples $V_{DY}$ correspond to the unaltered composite video of the previous frame. Since there is no motion the luminance component of signal $V_{DY}$ is correlated with the luminance component of the incomming samples but the chrominance component is shifted 180 degrees in phase. Under these conditions, and with the value of scale factor $K_o$ equal to one-half, the luminance and chrominance components from equations (4) and (5) are $$V_{LO} = \tfrac{1}{2} V_{LX} + (1 - \tfrac{1}{2}) V_{LX} = V_{LX} \quad (6)$$

$$V_{CO} = \tfrac{1}{2} V_{CX} + (1 - \tfrac{1}{2})(-V_{CX}) = 0 \quad (7)$$

which indicates that the chrominance component is completely cancelled during this frame. For this interval the system functions as a frame comb filter with a luminance output. Note that for this frame the chrominance $V_{CY}$ is equal to $V_{CS} K_m / (2 - K_m)$. These values will be the values $V_{CDY}$ during the next frame period and succeeding frame periods in which time there is no interframe image motion.

In the second and all succeeding frame periods in which there is no motion, the value of scale factor $K_o$ is set to $K_m/2$. Substituting this value for $K_o$ in equations (4) and (5) and solving $$V_{LO} = (K_m/2) V_{LX} + (1 - K_m/2) V_{LX} = V_{LX} \quad (8)$$

$$V_{CO} = (K_m/2) V_{CX} + (1 - K_m/2)(-V_{CX} K_m/(2-K_m)) = 0 \quad (9)$$

indicating that for all non motion frames the chrominance component is cancelled.

For the above system the motion adaptive circuit 31 provides the scale factors to scaling circuits 16 and 24. However, each set of scale factors will contain only three values as indicated in Table I.

TABLE I

| Motion Signal | Delayed Motion Signal | $K_o$ | $K_m$ |
|---|---|---|---|
| 0 | 0 | $K_{mi}/2$ | $K_{mi}$ |
| 0 | 1 | $\tfrac{1}{2}$ | $1/(2 - K_{mi})$ |
| 1 | 0 | 1 | 1 |
| 1 | 1 | 1 | 1 |

The value $K_{mi}$ is variable according to the noise content of the incoming signal. For instance, if the system determines that the signal contains a relatively low amplitude noise content the selected set of scale factors $K_o$ and $K_m$ may be derived from a value of $K_{mi}$ equal to $\tfrac{1}{4}$. Alternatively, if the signal contains more noise, the selected set of scale factors may be derived from a value of $K_{mi}$ equal to e.g. 1/16 or 1/32.

The circuitry circumscribed by the dashed box 31 is exemplary circuitry according to the present invention for generating the appropriate sequences of scale factors $K_m$ and $K_o$ on a pixel-by-pixel basis. This circuitry is responsive to the sample differences from subtractor 12. Note that if the input signal $V_x$ contains a chrominance component e.g. the input signal is composite video signal, the chrominance component of $V_{DY}$ will be 180 degrees out of phase with the chrominance component of input samples $V_x$, and they will add constructively in subtracter 12 even when there is no interframe image motion. The luminance components of input samples $V_x$ and delayed samples $V_{DY}$ will cancel in subtracter 12 when there is no motion and will produce sample differences when image changes occur from frame-to-frame. These luminance sample differences are an indication of image motion. In order to detect motion from the sample differences if the input signal contains chrominance, the chrominance component must be removed from the sample differences before they are applied to the motion detector.

The chrominance component of the sample differences is eliminated by the low-pass filter 27 which has a pass-band designed to attenuate the frequency spectrum occupied by chrominance signals. The luminance component of the sample differences from low-pass filter 27 is applied to the absolute value circuit 28 which converts all of the luminance sample differences to a single polarity, e.g. positive. These samples are applied to a second low-pass filter 32 which smooths the output of the absolute value circuit.

Output samples from low-pass filter 32 are applied to one input of the comparator 30 which compares them to a reference value from adder 42. If the samples from low-pass filter 32 exceed the reference value, comparator 30 provides a motion signal for the respective pixel sample, on output connection 31. Note low-pass filter 32, by smoothing the sample differences from circuit 28, tends to preclude the comparator from developing a jittering motion signal for successive samples. Note also that comparator 30 may alternatively be connected to compare the sample differences ahead of the absolute value circuit 28 as indicated by the phantom connection 29.

The motion—no motion signals from comparator 30 are applied to a motion memory 34 which delays them by one or more frame periods. The motion—no motion signals and delayed motion—no motion signals from comparator 30 and motion memory 34 are coupled as partial address codewords to ROM 38 which outputs the desired sequences of scale factors $K_m$ for scaling circuit 16 and scale factor $K_O$ for scaling circuit 24, on a pixel-by-pixel basis, examples of which are illustrated in Table I.

An assumption is made that every image frame will contain a portion of an image in which there is no motion. For this portion of the image, the amplitude of the sample differences from the output of subtracter 12 and consequently the output of low-pass filter 32 will correspond to the amplitude of the noise in the signal. It is further assumed that sample differences consisting of noise only, will have a lower amplitude than noise plus motion samples. Thus, if all the sample differences over the active image portion of each field (or frame) are measured to detect the smallest sample difference, this value will be representative of the noise in the respective field or frame.

Element 36 coupled to low-pass filter 32 detects the smallest sample difference in each field or frame. These differences are smoothed in low-pass filter 40 which is a digital filter clocked at the field or frame rate. The output of low-pass filter 40 is applied as one input to adder 42 and provides the base line for the reference values coupled to comparator 30. Onto this baseline is added a motion threshold value $V_{TH}$ supplied by source 44 to provide an additional degree of noise immunity to the motion detector for instantaneous noise signals. The motion reference value coupled to comparator 30 is therefore noise dependent.

In an alternative embodiment, adder 42 and source 44 may be replaced with e.g. a ROM having an address input port coupled to lowpass filter 40 and an output port coupled to comparator 30. This ROM will be programmed with appropriate reference values to correspond to the noise related signal applied as address codewords to its address input.

The noise related signal from low-pass filter 40 is also coupled to the input port of logic circuitry 46. Logic circuitry 46 develops codewords related to ranges of amplitudes of the noise related signals. A priority encoder such as the CD4532 integrated circuit manufactured by the Solid State Division of RCA Corporation is an example of the type of logic which may be implemented in logic circuit 46. The CD4532 develops a 3-bit output code effectively dividing an 8-bit input signal into eight ranges. For application to circuitry 31 of FIG. 1, it is not necessary to divide the noise related signal into as many as eight ranges. The number of ranges will nominally be determined by designer preference but it is anticipated that three or four ranges will be sufficient. To adapt a circuit such as the CD4532 to partition an 8-bit input signal into e.g., 4 ranges represented by two bit codewords, pairs of the input bit lines may be ORed together with their output connection coupled respectively to the least significant input bit positions of the encoder.

The noise range related codewords produced by logic circuitry 46 are concatenated with the motion-no motion signals from comparator 30 and motion memory 34, and then coupled to the address input port of ROM 38.

ROM 38 may be partitioned into pages, with the address bits provided by logic circuitry 36 enabling the particular page, and the address bits provided from motion memory 34 and comparator 30 selecting the particular scale factors from the respective page. The pages are addressed at a field or frame rate since information is provided to logic circuit 46 at a field or frame rate.

Each of the pages of ROM 38 will be programmed with a set or sets of scale factors appropriate for its respective range of noise amplitude.

Additional circuitry, for controlling selection of the scale factors on a pixel basis and related to the magnitude of image motion derived from the instantaneous amplitude of the difference samples from subtractor 12, may be coupled between low pass filter 27 and the address input of ROM 38. This additional circuitry may also comprise a priority encoder to generate additional address codeword bits for ROM 38. These additional address bits would be ORed with the address bits of logic circuitry 46 and effect (for limited motion) selection of the ROM 38 pages on a pixel basis. The larger the magnitude of image motion the larger the value of the scale factor $K_m$ that is selected.

Figure 2:
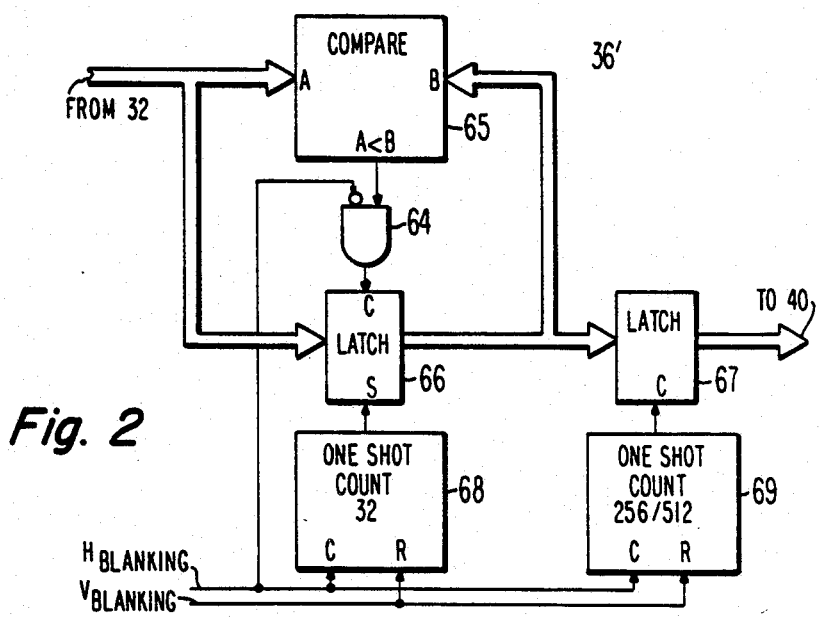
FIG. 2 is a block diagram of an exemplary minimum value detector for use in the FIG. 1 system.

FIG. 2 is exemplary circuitry of a minimum value detector 36' which may be substituted for element 36 of FIG. 1. The function of the circuit is to detect the lowest valued sample difference occurring in the active image portion of a video signal. Circuit 36' examines a major portion of each field, i.e. the portion starting with horizontal line 32 and ending with line 256, and only the active portion of these lines is examined.

The operation proceeds as follows. A parallel-bit latch 66 is preset to all ones by a digital one shot 68 at the beginning of the 32nd horizontal line. The value in the latch 66 is coupled as a reference value to one input of comparator 65. Difference samples from low-pass filter 32 are coupled to a second input of comparator 65 and to the data input of latch 66. If the difference sample value is less than the reference value, comparator 65 develops a control signal, to condition latch 66 to store the applied difference sample. The value of the difference sample stored in latch 66 becomes the new reference value for comparator 65. On the other hand if the applied difference sample from 32 is greater than the reference value, the current reference value is retained in latch 66. In effect, each successive sample is compared against an earlier lowest valued sample and if the current sample is lower in value than all earlier samples the current sample becomes the new reference.

Comparator 65 is coupled to the control input terminal of latch 66 by gate 64. Gate 64 having an input coupled to e.g. a horizontal blanking signal derived from the video signal is enabled to couple comparator 65 to latch 66 only during the active image portions of each horizontal line. Thus, samples occurring during the horizontal, back porch and color burst intervals are not included for minimum value detection.

At line 256 the value currently stored in latch 66 is loaded into latch 67 responsive to a control signal from one shot 69. This value is stored in latch 67 for the next field or frame period for use in determining the baseline of the reference vaue of comparator 30 and the K scale factors.

The digital one shot 68, which is responsive to horizontal and vertical blanking pulses, outputs a pulse at the beginning of the line 32 to set latch 66 to the maximum binary value commensurate with the number of sample bits stored in the latch to reinitialize the minimum value detector each field or frame of video information.

The digital one shot 69, which is also responsive to horizontal and vertical blanking pulses, generates an output clock signal to latch 67 at line 256 of the field interval (or line 512 of the frame interval) to load the value from latch 66 into latch 67. Digital one shot 69 and digital one shot 68 may consist of binary counters arranged to count 256 and 32 horizontal blanking pulses respectively.

What is claimed is:

1. Scale factor generating circuitry, for use with a video signal recursive filter including an input port, an output port from which a signal, delayed by substantially one frame period with respect to signal applied to said input port, is available, and means for scaling and combining said delayed signal and said signal applied to said input port, wherein the degree of scaling of said signal applied to said input port and said delayed signal is adaptively controlled by selective application of scale factors, said scale factor generating circuitry comprising:

means, coupled to said input port and said output port, for producing difference samples of signal separated by one frame period;

detection means, responsive to said difference samples, for producing a signal corresponding to the difference sample having the smallest magnitude over a predetermined portion of a frame period;

means, responsive to the signal produced by said detection means, for generating a threshold value;

comparator means, responsive to said difference samples and said threshold value, for producing at an output port thereof, a motion signal whenever the magnitude of a difference sample is greater than the magnitude of the threshold value; and means, including means responsive to said motion signal, for producing said scale factors.

2. The scale factor generating circuitry set forth in claim 1 wherein the means including means responsive to said motion signal comprises:

memory means, having an address input port coupled to said comparator means output port, which is programmed to output predetermined scale factors corresponding to motion signals applied as address codes to said address input port.

3. The scale factor generating circuitry set forth in claim 2, wherein the means including means responsive to said motion signal further includes:

means, responsive to the signal produced by said detection means, for generating codewords corresponding to predetermined magnitude ranges of the difference sample having the smallest magnitude; and means for concatenating the codewords corresponding to predetermined magnitude ranges with said motion signal to form composite address codes and applying said composite address codes to said memory means.

4. The scale factor generating circuitry set forth in claim 3 wherein said memory means is coupled to said comparator means, by means including a delay means, for delaying said motion signal by at least one frame period.

5. A scale factor generating circuit for a video signal recursive filter including, means for delaying an incoming signal by substantially at least one frame period and means for scaling and combining said incoming and delayed signals, which scaling means has a control input port for applying control signals corresponding to scale factors, said scale factor generating circuit comprising:

means, responsive to said incoming and delayed signals, for developing difference samples indicative of image motion between successive frames;

means, responsive to the difference samples, for developing a signal sample representative of the minimum noise in an image portion of a frame period;

means, responsive of said signal sample representative of the minimum noise, for developing a threshold value;

means, responsive to said difference samples and said threshold value, for producing a motion signal when the magnitude of a difference sample exceeds the magnitude of said threshold value; and means, responsive to said motion signal, for generating said control signals.

6. The scale factor generating circuit set forth in claim 5 wherein the means for generating said control signals comprises:

delay means, coupled to said means for producing said motion signal, for delaying the motion signal by at least one frame period;

means, responsive to said motion signal and delayed motion signal, for generating predetermined control signals in accordance with the history of image motion indicated by said motion signal and said delayed motion signal.

7. The scale factor generating circuit set forth in claim 6 wherein the means for generating control signals further comprises:

means, responsive to said signal sample representative of the minimum noise, for producing a sample value corresponding to a particular one of a predetermined number of amplitude ranges encompassing said signal sample; and means, responsive to said sample value corresponding to said one of the number of ranges, for selecting a predetermined set of said predetermined control signals from which said means responsive to said motion and delayed motion signals select said control signals.

8. Scale factor generating circuitry for a video signal recursive filter comprising:

a video signal input port;

delay means, having an input port, and having an output port at which a signal delayed by substantially at least one video frame period is available;

a subtractor circuit, a scaling circuit and an adder serially coupled in the order recited, said adder having an output port coupled to the input port of said delay means, and having an input port coupled to one of said delay means output port and said video signal input port, said subtractor circuit having a first input port coupled to the output port of said delay means and a second input port coupled to said video signal input port, and said scaling circuit having a control signal input port for applying control signals corresponding to respective scale factors;

means, coupled to said subtractor circuit and responsive to difference signals produced thereby, for determining the minimum difference signal over a period substantially equal to at least one half of a frame period;

means, responsive to said minimum difference signal, for producing a threshold value having a magnitude which is a predetermined quantity greater than said minimum difference signal; and means, responsive to said threshold value and said difference signal, for producing said control signals.

9. The scale factor generating circuitry set forth in claim 8 wherein said means for producing said control signals comprises:

a comparator, coupled to said subtractor and said threshold value producing means, for generating a motion signal when the magnitude of said difference signals exceed the magnitude of said threshold value;

means, responsive to said minimum difference signal, for producing a range signal corresponding to one of a predetermined number of amplitude ranges; and control signal producing means, responsive to said range signal, to select one set of a predetermined number of sets of control signals and responsive to said motion signal to select control signals from the related set of control signals.

* * * * *